(12) United States Patent
An et al.

(10) Patent No.: US 12,170,527 B2
(45) Date of Patent: Dec. 17, 2024

(54) HIGH LINEARITY RESISTIVE DIGITAL-TO-ANALOG CONVERTERS WITH DYNAMIC CONTROL FOR TEMPERATURE AND VOLTAGE INVARIANT ON-RESISTANCE OF SWITCHES

(71) Applicant: Infinera Corporation, San Jose, CA (US)

(72) Inventors: Fu-Tai An, San Jose, CA (US); Mariam Hoseini, San Jose, CA (US); Jan-Harm Nieland, Santa Clara, CA (US)

(73) Assignee: Infinera Corporation, San Jose, CA (US)

( * ) Notice: Subject to any disclaimer, the term of this patent is extended or adjusted under 35 U.S.C. 154(b) by 10 days.

(21) Appl. No.: 17/852,312

(22) Filed: Jun. 28, 2022

(65) Prior Publication Data

US 2022/0416805 A1    Dec. 29, 2022

Related U.S. Application Data

(60) Provisional application No. 63/215,808, filed on Jun. 28, 2021.

(51) Int. Cl.
*H03M 1/78* (2006.01)
*H03M 1/76* (2006.01)

(52) U.S. Cl.
CPC ............. *H03M 1/785* (2013.01); *H03M 1/76* (2013.01)

(58) Field of Classification Search
CPC ......... H03M 1/76; H03M 1/089; H03M 1/785
See application file for complete search history.

(56) References Cited

U.S. PATENT DOCUMENTS

| | | | | |
|---|---|---|---|---|
| 5,075,677 A * | 12/1991 | Meaney | ..................... | G05F 3/24 341/154 |
| 5,525,986 A * | 6/1996 | Kovacs | ................. | H03M 1/785 341/154 |
| 5,703,588 A * | 12/1997 | Rivoir | ................. | H03M 1/0604 341/145 |
| 5,969,658 A * | 10/1999 | Naylor | ..................... | H03M 1/68 341/145 |
| 6,150,971 A * | 11/2000 | Naylor | .................. | H03M 1/089 341/154 |
| 6,633,246 B1 * | 10/2003 | Bowers | ................. | H03M 1/089 341/144 |
| 7,253,700 B1 * | 8/2007 | Chiu | .................... | H03G 1/0088 333/81 R |

(Continued)

Primary Examiner — Lam T Mai

(57) ABSTRACT

Circuitry is disclosed herein that dynamically (temperature-invariant and voltage-invariant) adjusts the Ron of switches in a resistive Nyquist-rate digital to analog converter (DAC) to thereby reduce DAC nonlinearity errors and improve INL results of greater than 16b. Consistent with the present disclosure, the DAC includes an R-2R ladder in which each bit corresponds to a switch. A control circuit is provided for generating signals applied to the gate of the switch to cause the on-resistances of the switch to be a particular value, such that the on-resistance of the switch plus the sum of two resistors, one having the resistance R, and the other having a resistance R' is equivalent to the resistance of the 2R-size resistors or twice the resistance of the R-sized resistors in the ladder.

7 Claims, 9 Drawing Sheets

(56) References Cited

U.S. PATENT DOCUMENTS

| | | | | |
|---|---|---|---|---|
| 7,336,211 B1* | 2/2008 | Lai | ............... | H03M 1/06 |
| | | | | 341/118 |
| 7,710,302 B2* | 5/2010 | Ladanza | ............... | H03M 1/06 |
| | | | | 341/145 |
| 8,537,043 B1* | 9/2013 | McLachlan | ............... | H03K 17/063 |
| | | | | 375/232 |
| 8,581,766 B1* | 11/2013 | Li | ............... | H03M 1/785 |
| | | | | 341/145 |
| 9,871,531 B1* | 1/2018 | Fang | ............... | H03M 1/68 |
| 10,128,865 B1* | 11/2018 | Yang | ............... | H03M 1/682 |
| 10,784,886 B1* | 9/2020 | Zhang | ............... | H03M 1/785 |
| 2001/0033242 A1* | 10/2001 | Castaneda | ............... | H03M 1/06 |
| | | | | 341/154 |
| 2006/0244645 A1* | 11/2006 | Ozalevli | ............... | H03M 1/74 |
| | | | | 341/144 |
| 2008/0055135 A1* | 3/2008 | Li | ............... | H03M 1/765 |
| | | | | 341/144 |
| 2010/0315277 A1* | 12/2010 | Mclachlan | ............... | H03M 1/0845 |
| | | | | 341/144 |
| 2014/0210657 A1* | 7/2014 | Suzuki | ............... | H03M 1/0612 |
| | | | | 341/154 |
| 2019/0372586 A1* | 12/2019 | Zhang | ............... | H03M 1/06 |

* cited by examiner

HIGH LINEARITY RESISTIVE DIGITAL-TO-ANALOG CONVERTERS WITH DYNAMIC CONTROL FOR TEMPERATURE AND VOLTAGE INVARIANT ON-RESISTANCE OF SWITCHES

The present patent application hereby claims priority to the provisional patent application identified by U.S. Ser. No. 63/215,808 filed on Jun. 28, 2022, the entire content of which is hereby incorporated by reference.

BACKGROUND

Digital-to-analog converters (DACs) are known circuits that typically receive a digital signal including a series of bits or a "code", for example, and provide a corresponding analog voltage output. DACs often include a resistor "ladder", which is a repetitive arrangement of precise resistor networks in a ladder-like configuration. Each "rung" of the ladder is selectively coupled to either a reference voltage or ground by way of a switch, such as a transistor, such that the output of the DAC is supplied from an end of the ladder and is a weighted voltage based on the resistor rungs that are connect to the reference voltage. One type of a DAC includes a so-called "R-2R" resistor ladder network, which includes resistors of two different values connected in parallel, and their ratio is 2:1. Alternatively, each rung of the R-2R ladder may include a resistor having a given value connected in parallel with two resistors, each having that value.

Often metal oxide semiconductor (MOS) transistors, such as n-channel (NMOS) and p-channel (PMOS) transistors are used as the switches in a DAC, whereby the gate voltage controls the resistance between its source and drain. For a square-law n-channel MOS (NMOS) transistor operating in the linear (triode) region, this resistance can be expressed as:

$$R_{on} = \frac{1}{\mu_n C_{ox} \frac{W}{L}(V_{GS} - V_{TH})}$$

Where $\mu_n$ is the electron mobility in the channel, Cox is the gate oxide capacitance per unit area, W and L are the effective width and length of the transistor, respectively, VGS is the gate-source voltage, and VTH is the threshold voltage of the transistor.

Although MOS transistors are relatively simple to implement, these devices may have a large on-resistance. FIG. 1a shows on-resistance of NMOS, PMOS, and complementary MOS (CMOS) switches as a function of Vin or gate-source voltage (VGS). As shown in FIG. 1a, the on-resistances of NMOS and p-channel MOS (PMOS) transistors depend on the overdrive voltage (e.g., VOD=VGS−VTN for the NMOS transistor) for each device. Such on-resistance of the DAC switches can cause of the output of the DAC to be nonlinear relative to the digital inputs by contributing to the resistance of each rung whereby the 2:1 resistance ratio is not maintained.

Moreover, the resistors of the ladder noted above may introduce differential and integral nonlinearities, whereby the voltage outputs of the DAC do not linearly correspond to the digital (e.g., binary) inputs or input code. Such errors result from mismatches in the resistors that constitute the ladder. For example, due to process variations, some resistors of the ladder may have a different size than other resistors such that the resistance ratio of 2:1 is not maintained for this additional reason. Another source of mismatch arises from the on-resistance voltage losses across CMOS switches. Also, unequal resistance of the PMOS and NMOS switch pairs in FIG. 2 causes integral nonlinearity (INL), which is a measure of the deviation between the ideal output value and the actual measured output value for a certain input code.

Various solutions have been proposed to offset or correct for resistance variations in the ladder, such as by equalizing NMOS and PMOS switch resistance. In another solution, the "on" gate voltage of the Vref− (ground) switch is adjusted in accordance with the value of Vref+, to give switch $V_{GS}$ equality and therefore on resistance matching with the Vref+ switch over a wide range of reference voltage.

In another approach, the on resistance of the P-channel MOSFET is adjusted to match that of the N-channel MOSFET by driving the gate of each P-channel MOSFET with the output of a CMOS inverter referenced between the supply and a temperature-invariant reference voltage that is adjusted to cause the on resistances of a P-channel monitor MOSFET and an N-channel monitor MOSFET to be equal. However, the voltage losses across CMOS switches depend on temperature and reference voltage and suffer from an inherent nonlinearity according to the $V^2_{DS}$ term in:

$$I_{DS} = \mu C_{ox} \frac{W}{L}\left((V_{GS} - V_T)V_{DS} - V_{DS}^2\right)$$

In addition, although these solutions resolve the issue of unequal resistance of PMOS and NMOS switches, they do not address the mismatch problem caused by extra resistance introduced by the switches.

In light of the above-described resistor mismatch, conventional DACs have had a practical achievable accuracy of such circuits have previously limited them to 16b INL.

A force and sense approach has also been proposed to reduce INL from CMOS switch resistance. Each NMOS and PMOS switch in a conventional resistor divider or ladder DAC is replaced by a pair of force and sense switches that are switched in tandem. Well junction leakage flow through the switches also contributes to INL which is mitigated through a specific well-biasing technique. This technique reduces the INL to a sub-ppm level at the expense of quadrupled number of switches which are required to be binary weighted. Extreme attention to parasitic capacitance (and its impact on delay and glitch) and multi-level segmentation with associated dedicated low offset and low noise op-amps are required.

SUMMARY

Consistent with an aspect of the present disclosure, a digital-to-analog converter (DAC) circuit is provided that includes a resistor ladder including a plurality of stages, one of the stages including a first resistor and a second resistor. The DAC circuit also includes a switch including a transistor coupled to one of the first and second resistors. Further, the DAC circuit includes a control circuit operable to adjust an on-resistance of the transistor, such that a sum of the resistances of the first and second resistors and the on resistance is equal to a predetermined amount.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) and together with the description, serve to explain the principles of the invention.

DESCRIPTION OF THE EMBODIMENTS

Circuitry is disclosed herein that dynamically (temperature-invariant and voltage-invariant) adjusts the Ron of switches in a resistive Nyquist-rate digital to analog converter (DAC) to thereby reduce DAC nonlinearity errors and improve INL results of greater than 16b. Consistent with the present disclosure, the DAC includes an R-2R ladder in which each bit corresponds to a switch. If the input bit is 1, a p-channel MOS switch transistor connects the corresponding 2R resistor to a supply voltage Vref+, and, if the input bit is 0, a n-channel MOS transistor switch connects the corresponding 2R resistor to Vref− (e.g., ground). In such a ladder, the resistor of size or value 2R can be made of two resistors of size or value R, in series, to achieve the required matching of 2R-sized resistors to that of R-sized resistors. However, because 2R-sized resistors are in series with p-channel or n-channel switches, the on-resistance of switches contribute to the mismatch between 2R-sized and R-sized resistors, which degrades the linearity of the DAC and adversely impacts INL.

Consistent with an aspect of the present disclosure, a control circuit for generating signals applied to the gate of both p-channel and n-channel switches to cause their on-resistances to be a particular value, such that the on-resistance of the switch plus the sum of two resistors, one having the resistance R, and the other having a resistance R' is equivalent to the resistance of the 2R-size resistors or twice the resistance of the R-sized resistors in the ladder.

The control circuit or loop includes a replica of a branch of the R−(R+R') ladder with the same resistor and switch sizes, one with the n-channel switch and one with the p-channel switch. A low-offset and low-noise operational amplifier (op-amp) adjusts the gate voltage of the switch transistor to a condition wherein a sum of the switch on-resistance plus the R'-sized resistor and the R-sized resistor is equal to the value or resistance of a 2R-sized resistor.

As the control loop constantly runs in the background, the gate voltages are regulated to compensate for or offset any changes in temperature or voltage. These voltages power the drivers for the n-channel and p-channel switches connected to the R-2R ladder.

Consistent with the present disclosure, a high-resolution DAC (>16b) with improved linearity (INL) can be realized in a small integrated circuit area.

Reference will now be made in detail to the present exemplary embodiments of the present disclosure, which are illustrated in the accompanying drawings. Wherever possible, the same reference numbers will be used throughout the drawings to refer to the same or like parts.

Figure 1A:
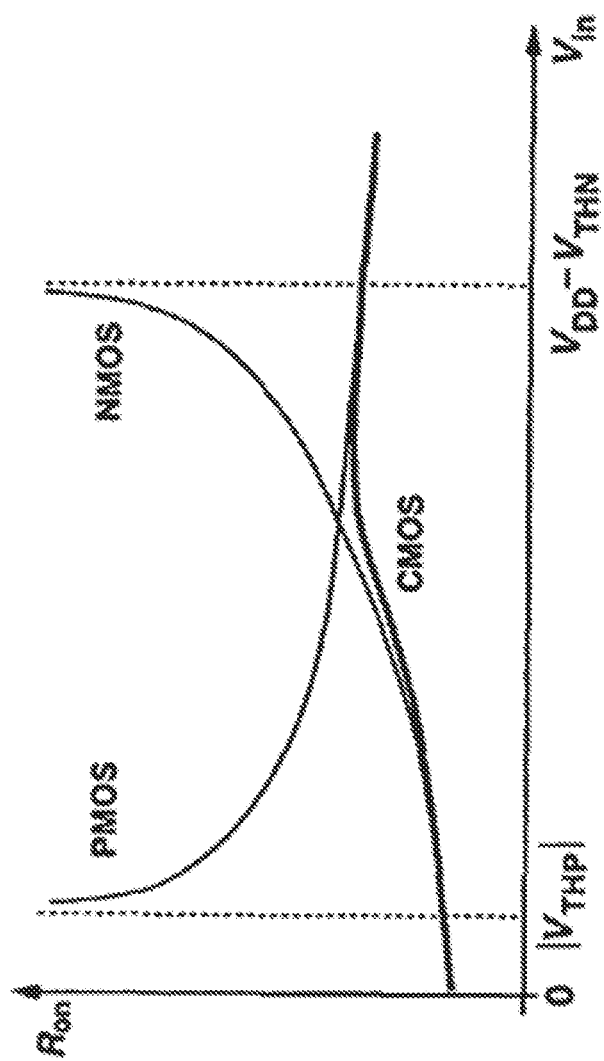
FIG. 1a illustrates plots of on-resistance associated with NMOS, PMOS, and CMOS switches.
Figure 1B:
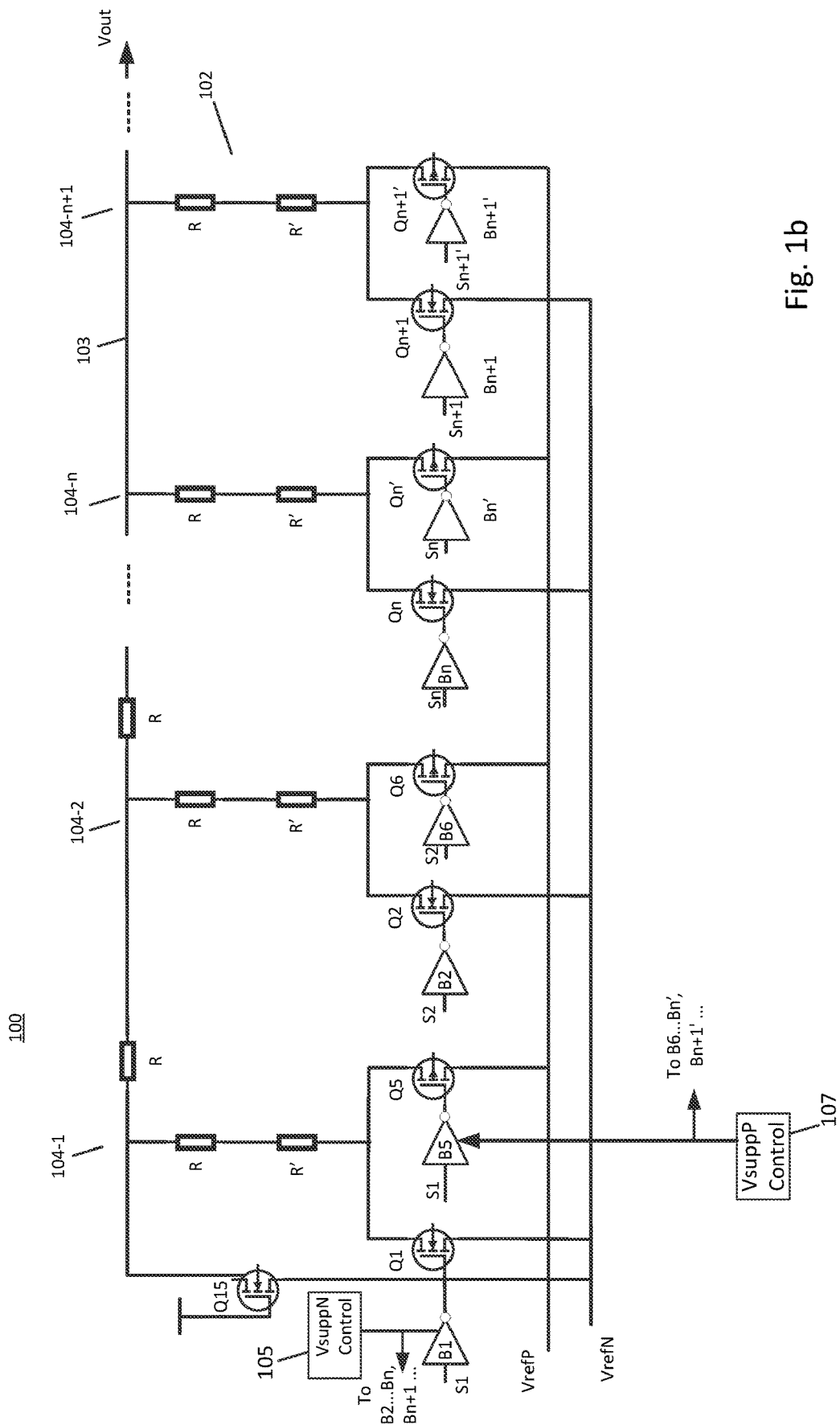
FIG. 1b shows a DAC consistent with the present disclosure.

FIG. 1b shows an example of a DAC 100 consistent with an aspect of the present disclosure. DAC 100 includes a resistor ladder or network 102, which has a plurality of stages or sections 104-1, 104-2 . . . 104-n, 104-n+1. Some stages, such as stages 104-1 and 104-2 include an R value or size transistor in parallel with an R and R' sized transistors connected in series, and other stages include R and R' sized transistor connected in series without the additional R sized transistor connected in parallel.

As further shown in FIG. 1b, a pair of switches including n-channel and p-channel transistors is associated with each stage 104 of ladder 102. For example, n channel transistor Q1 and p channel transistor Q5 are connected in parallel to resistor R' of stage 104-1; n channel transistor Q2 and p channel transistor Q6 are connected in parallel to resistor R' of stage 104-2; n channel transistor Qn and p channel transistor Qn' are connected in parallel to resistor R' of stage 104-n; and n channel transistor Qn+1 and p channel transistor Qn+1' are connected in parallel to resistor R' of stage 104-n+1. Each of inverter or buffer circuits B1, B5, B2, B6, Bn, Bn', Bn+1, and Bn+1' is connected to a gate of a respective one of transistors Q1, Q5, Q2, Q6, Qn, Qn', Qn+1, and Qn+1'. In addition, bits S1, S2, Sn, and Sn+1 of a code supplied to DAC 100 are provided to the inverter circuits in the following manner: bit S1 is supplied to inverters B1 and B5; bit S2 is supplied to inverter B2 and B6; bit Sn is supplied to inverter Bn and Bn', and bit Sn+1 is supplied to inverters Bn+1 and Bn+1'. In addition, a transistor Q15 is provided to appropriately bias an end of the ladder 102 to reference voltage vrefN, which is also connected to each of transistors Q1, Q2, Qn, and Qn+1. Further, each of transistors Q5, Q6, Qn', and Qn+1' is connected to voltage reference vrefP.

As noted above, each input bit (S1, S2, Sn and Sn) is supplied to an inverter pair. Thus, for example, if the input bit S1 is at a relatively high voltage or a '1', both inverters B1 and B5 output low voltages. When applied to the gate of transistor Q1, the transistor is cutoff. However, such low voltage, when applied to the gate of transistor Q5, turns transistor Q5 on to thereby connect resistor R' of stage 104-1 to output portion 103 of ladder 102 and supply a high voltage vrefP to output portion 103. If input bit S1 is a low voltage or ground corresponding to a '0' bit, the output of inverters B1 and B5 are at a relatively high voltage such that transistor Q1 turns on and transistor Q5 is shut off. As a result, transistor Q1 connects, via resistor R' of stage 104-1, a low voltage, vrefN, or ground, to output portion 103. Other inverters and transistor switches shown in FIG. 1b operate in a similar manner to provide weighted voltages to output portion 103 of DAC 100.

It is noted that in a parallel-resistor-divider DAC, the INL contribution from an error in switch or transistor on-resistance depends on that error compared to the total series resistance of a resistor stage 104 of ladder 102:

$$INL \cong \frac{\Delta R_{sw}}{2R_{unit} + R_{sw}}$$

Where 2Runit is, in the above example, R+R', and Rsw is the on-resistance of the transistor switch. ΔRsw is an error of the switch resistance.

The on-resistance of each transistor switch, however, can change based on the applied gate voltage. Accordingly, by applying an appropriate gate voltage to the switch the on-resistance can be set so that a sum of the on-resistance, R', and R is set to a predetermined value, such as 2R, and be equivalent to the value of a two R-sized resistors, which is twice the value of the R-sized resistors in satisfy the resistor matching criteria noted above. Namely, provided that each stage 104 has the same 2 R resistance a highly linear output of the DAC can be achieved.

Accordingly, consistent with an aspect of the present disclosure, circuit VsuppN control 105 provides a reference voltage to inverters B1, B2, Bn, and Bn+1, such that these inverters output the reference voltage VsuppN to the gate of a corresponding n channel switch when a low bit is input to the inverter. The reference voltage is adjusted so that the voltage applied to the gate of the corresponding n channel switch creates an on-resistance of the switch that, when added to resistors R' and R of a corresponding stage 104 yields a total resistance of 2R for the corresponding stage 104.

In addition, circuit VsuppP control 107 provides a reference voltage to inverters B5, B6, Bn', and Bn+1', such that these inverters output the reference voltage VsuppP to the gate of a corresponding p channel switch when a high bit is input to the inverter. The reference voltage is adjusted so that the voltage applied to the gate of the corresponding p channel switch creates an on-resistance of the switch that, when added to resistors R' and R, yields a total resistance of 2R for the corresponding stage 104.

Figure 1C:
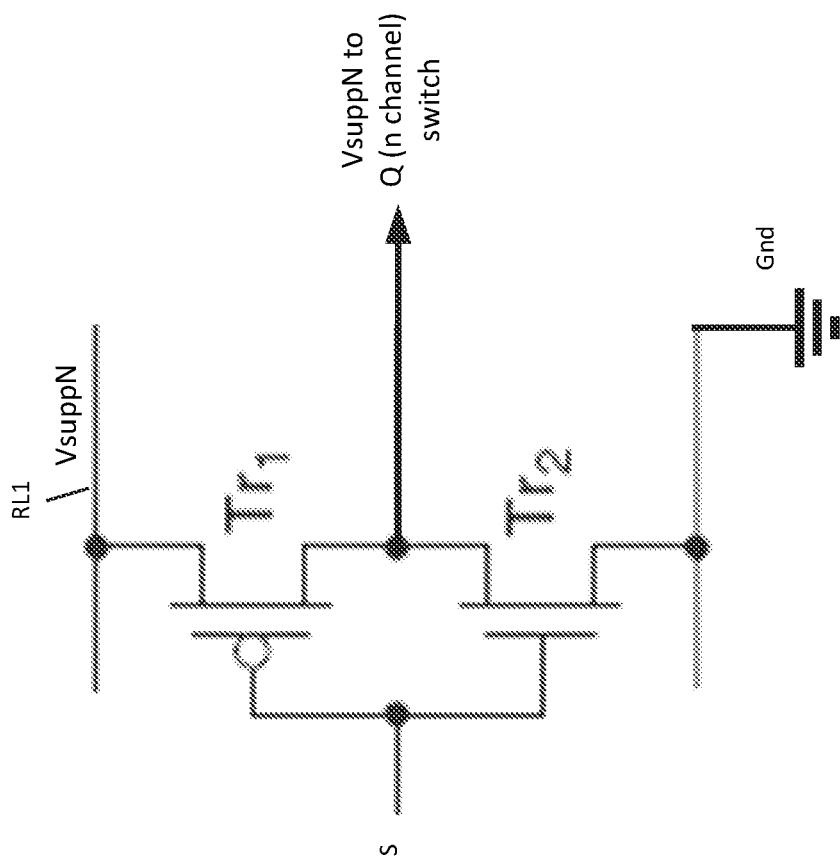
FIGS. 1c and 1d show buffer circuits consistent with the present disclosure.

FIG. 1c shows an example of inverter B1. It is understood that inverters B2, Bn, and Bn+1 have a similar structure and operate in a similar manner as inverter 1 to provide a gate voltage that yields a desired on-resistance, as described above. Inverter B1 is a CMOS inverter including a p channel transistor Tr1 and an n channel transistor Tr2. Transistor Tr2 may be connected to ground, as shown in FIG. 1c and transistor Tr1 is connected to rail RL1, which is set to the reference voltage VsuppN output from control circuit 105. Reference voltage VsuppN is output form inverter B1 when a low bit S1 is applied to the gates of transistors Tr1 and Tr2.

Figure 1D:
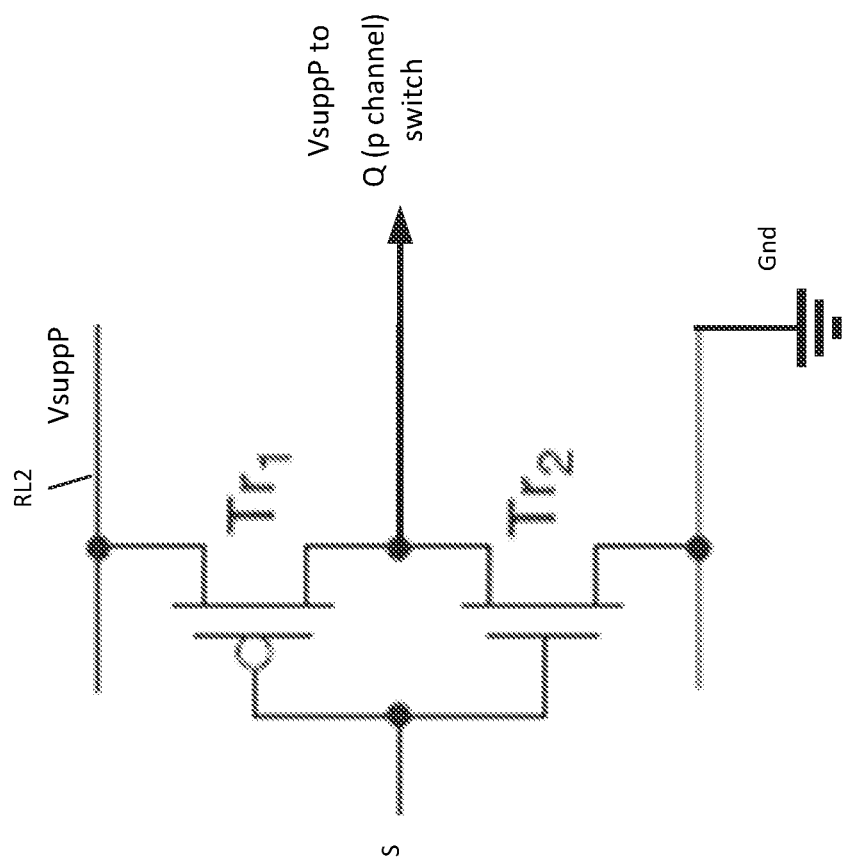

FIG. 1d shows an example of inverter B5, which is a CMOS inverter similar to that shown in FIG. 1c. In FIG. 1d, however, reference voltage VsuppP is connected to rail RL1 and is output from inverter B5 when the input bit S is low. It is understood that inverts B6, Bn', and Bn+1' have a similar structure and operate in a similar manner as inverter B5 to provide an appropriate gate voltage to adjust the on-resistance of a corresponding switch, as described above.

Figure 2:
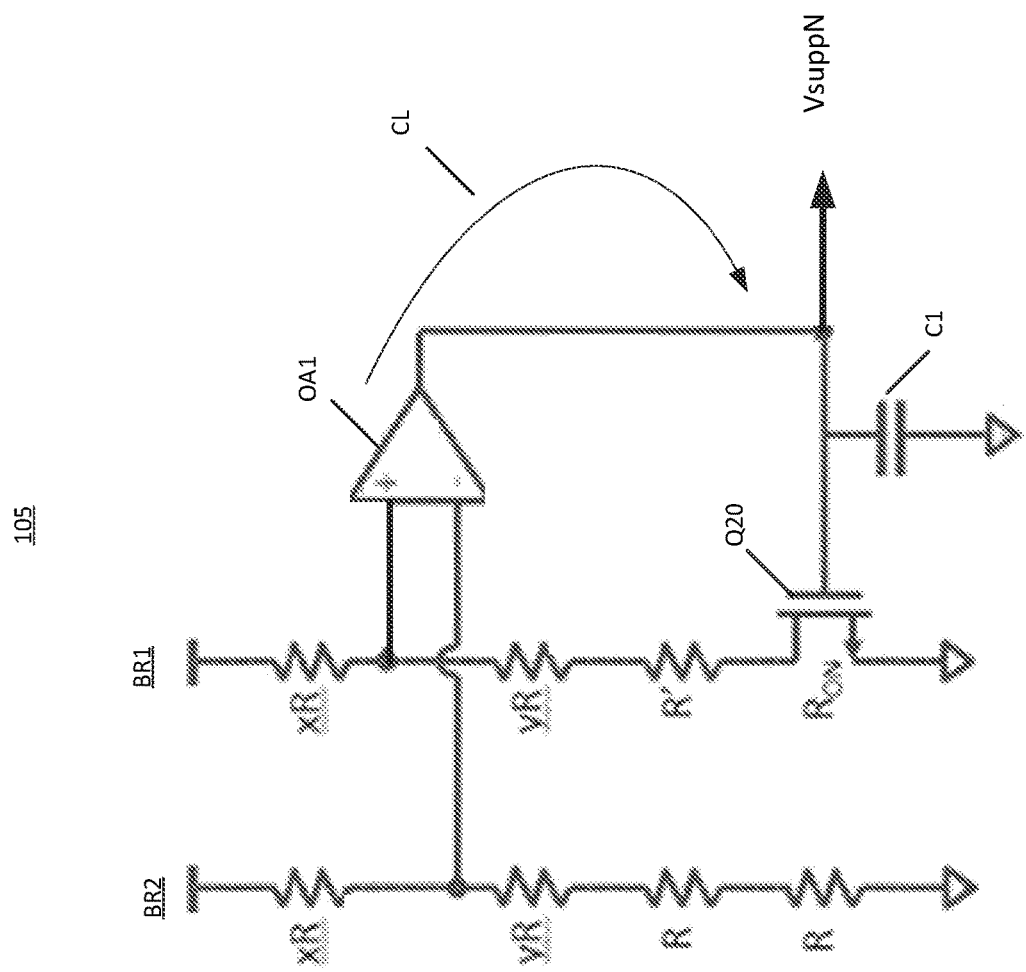
FIG. 2 illustrates an example of a circuit for controlling an n-channel MOS transistor DAC switch consistent with the present disclosure.

FIG. 2 shows an example of a control circuit 105 consistent with an aspect of the present disclosure. Control circuit 105 includes a replica of a branch of the R–(R+R') ladder (i.e., branch BR1 in FIG. 2) with the same resistors (R and R') and n channel switch (Q2) sizes. Control circuit 105 also includes branch BR2 including two resistors each having resistance R. Optional resistors xR and yR are provided in branches BR2 to provide a greater range of output voltages VsuppN. A low-offset and low-noise operational amplifier (op-amp) OA1 adjusts the gate voltage of the switch to a condition wherein the switch on-resistance plus the R'-sized resistor and the R-sized resistor precisely adds up to the value of a 2R-sized resistor. OA1 has a non-inverting input connected between a power supply and resistor R' of branch BR1 and an inverting input connected between one of resistors R of branch B2 and the power supply.

If due to temperature changes, the resistance of resistor R' in branch BR1 is reduced, such resistance change will result in a voltage change at the non-inverting input of operational amplifier OA1, thereby causing OA1 to output a voltage to the gate of n channel transistor Q20 to increase the on-resistance of transistor Q20 and thereby offset the reduced resistance of resistor R' in branch BR1. Since a similar resistance change would likely be experienced by resistor R' in stage 104-1, the same gate voltage (VsuppN) is applied as a reference voltage to rail RL1 of inverter B1. As a result, VsuppN is output from inverter B1 to the gate of switch Q1, so that the sum of the on-resistance of switch Q1, resistor R' in stage 104-1 and resistor R in stage 104-1 is equal to 2R, for example. As the control loop CL including OA1 and transistor Q20 constantly runs in the background, the gate voltages are regulated with any changes in temperature or voltage. These voltages power the drivers for the n-channel and p-channel switches in DAC 100 that are associated with R-2R ladder 102.

As further shown in FIG. 2 a capacitor C1 may be provided to reduce high frequency noise in the output VsuppN.

Figure 3:
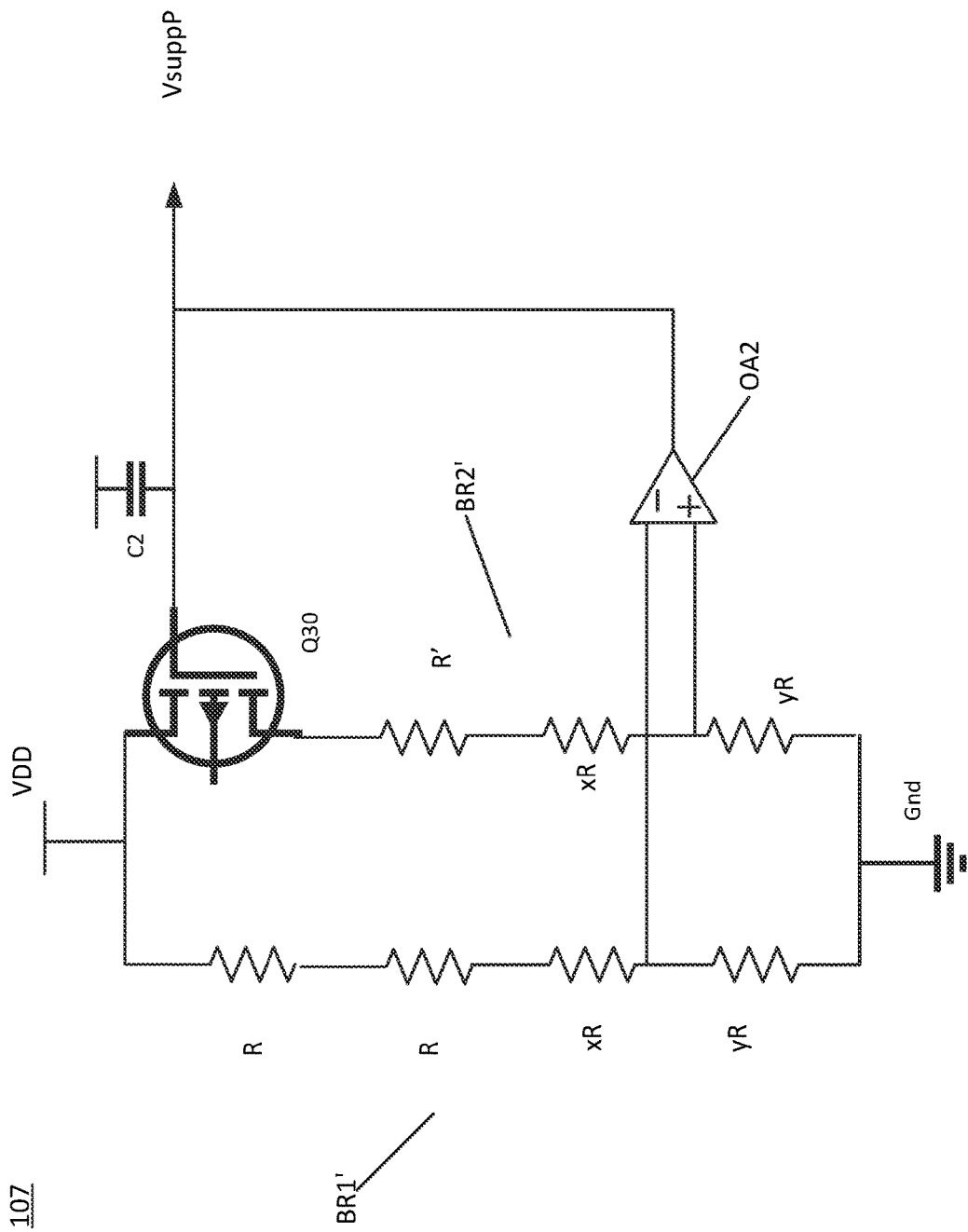
FIG. 3 illustrates an example of a circuit for controlling a p-channel MOS transistor DAC switch consistent with the present disclosure.

FIG. 3 shows an example of control circuit 107, which includes branches BR1' and BR2'. Branch BR1' includes two resistors connected in series, each having a resistance R. Branch BR2' includes resistors R' and p channel transistor Q30 connected in series. In addition, an operational amplifier (op amp) OA2 is provided that has an inverting input connected between ground and one of the R resistors of branch BR1', and a non-inverting input connected between resistor R' and ground. Op amp OA2 operates in a similar manner as op amp OA1 to output a reference voltage (VsuppP) to the gate of transistor Q30 to adjust the on-resistance thereof to offset changes in resistance of the resistors in branches BR1' and BR2'. VsuppP is also provided to rail RL2 of the p-channel inverters, such as inverters B5 and B6, such that these inverters output voltages to the gates of the corresponding p channel switch so that the p channel switches have appropriate offsetting on-resistances.

As further shown in FIG. 3, resistors xR and yR are provided in branches BR1' and BR2' to provide a greater output range of reference voltages. Also, capacitor C2 is provided to reduce high frequency noise in VsuppP in a manner similar to that described above in connection with capacitor C1 shown in FIG. 2.

Figure 4:
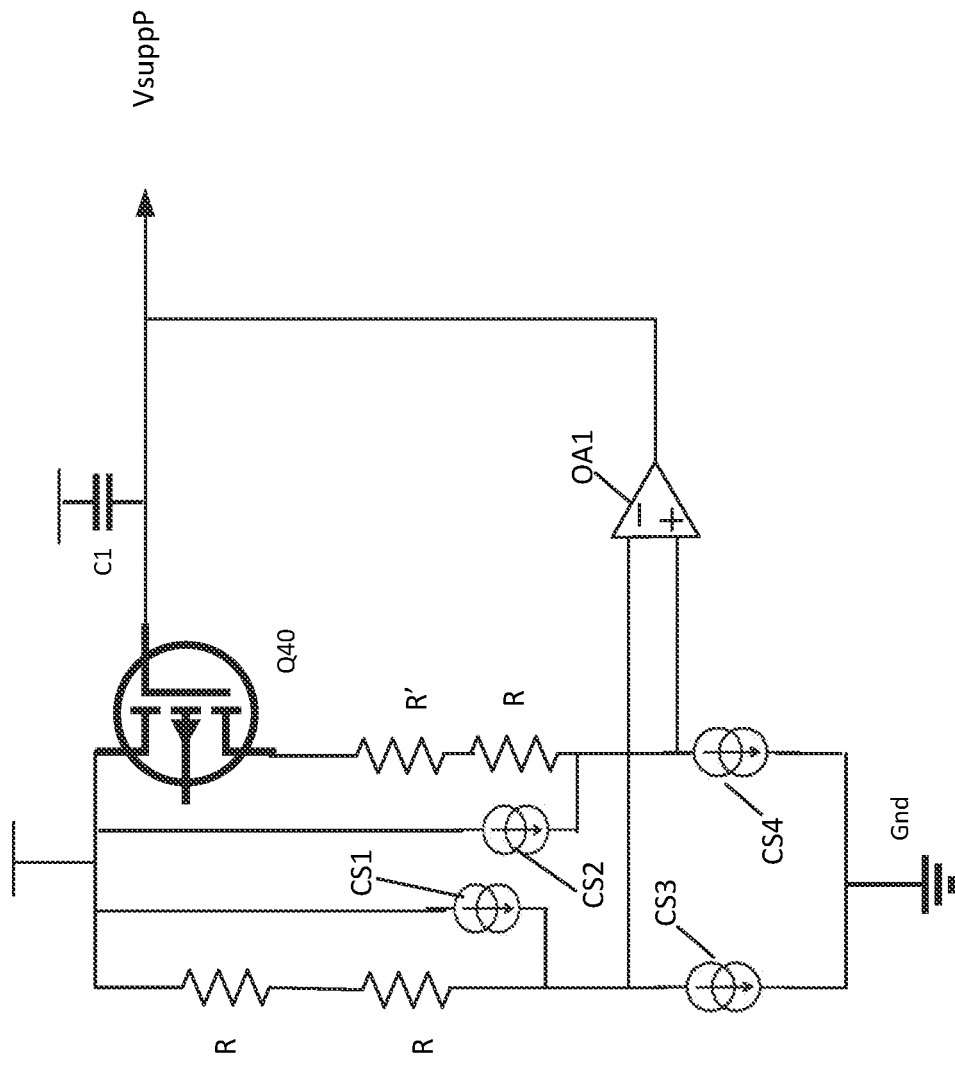
FIG. 4 illustrates another example of a circuit for controlling an n-channel MOS transistor DAC switch consistent with a further aspect of the present disclosure.

FIG. 4 shows another example of a control circuit for adjusting the n-channel switch on-resistance. Here, current sources CS1 and CS2 are provided as shown in FIG. 4 which provide currents based on the output of DAC 100. Accordingly, the currents provided by sources CS1 and CS2 provide additional control of output VsuppN. Current sources CS3 and CS4 are typically fixed and not adjusted based on the output of DAC 100.

Figure 5:
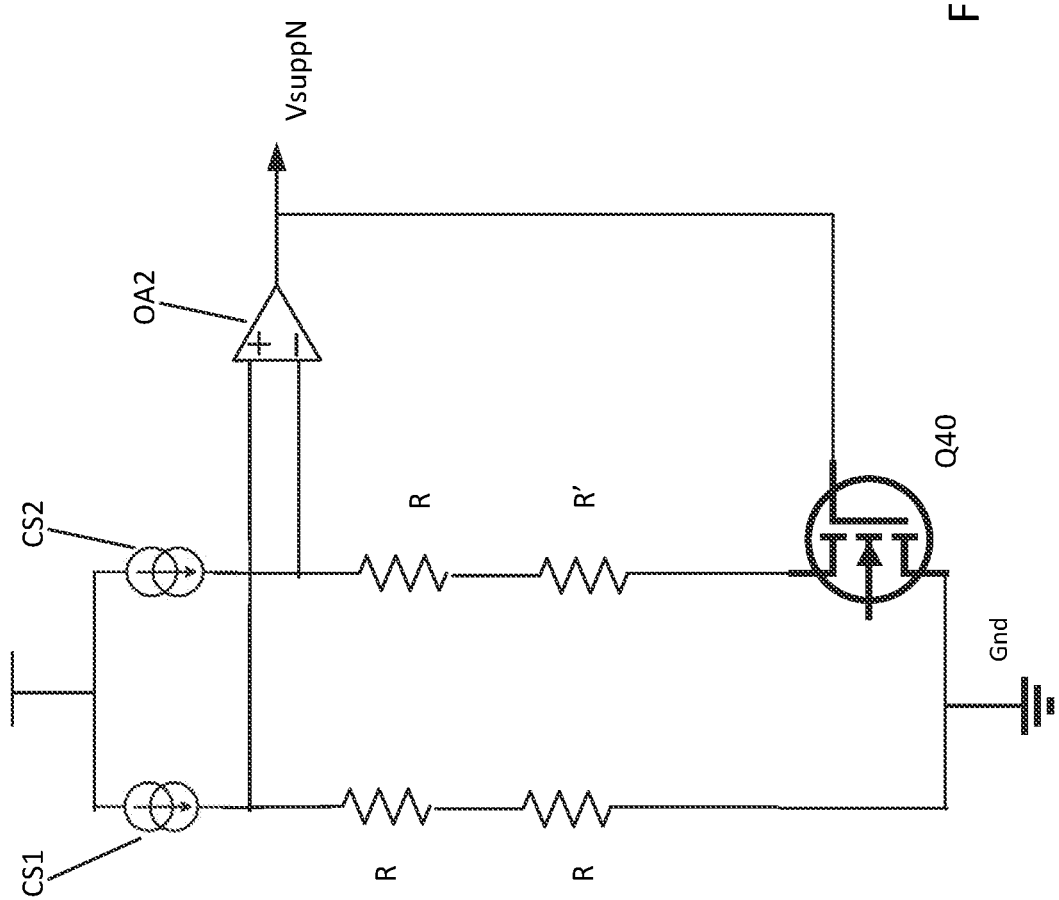
FIG. 5 illustrates another example of a circuit for controlling a p-channel MOS transistor DAC switch consistent with a further aspect of the present disclosure.

FIG. 5 shows another example of a control circuit for adjusting the p-channel switch on-resistance. Here, current sources CS1 and CS2 are provided and connected as shown in FIG. 5 which provide currents based on the output of DAC 100. Accordingly, the currents provided by sources CS1 and CS2 provide additional control of output VsuppN.

Figure 6:
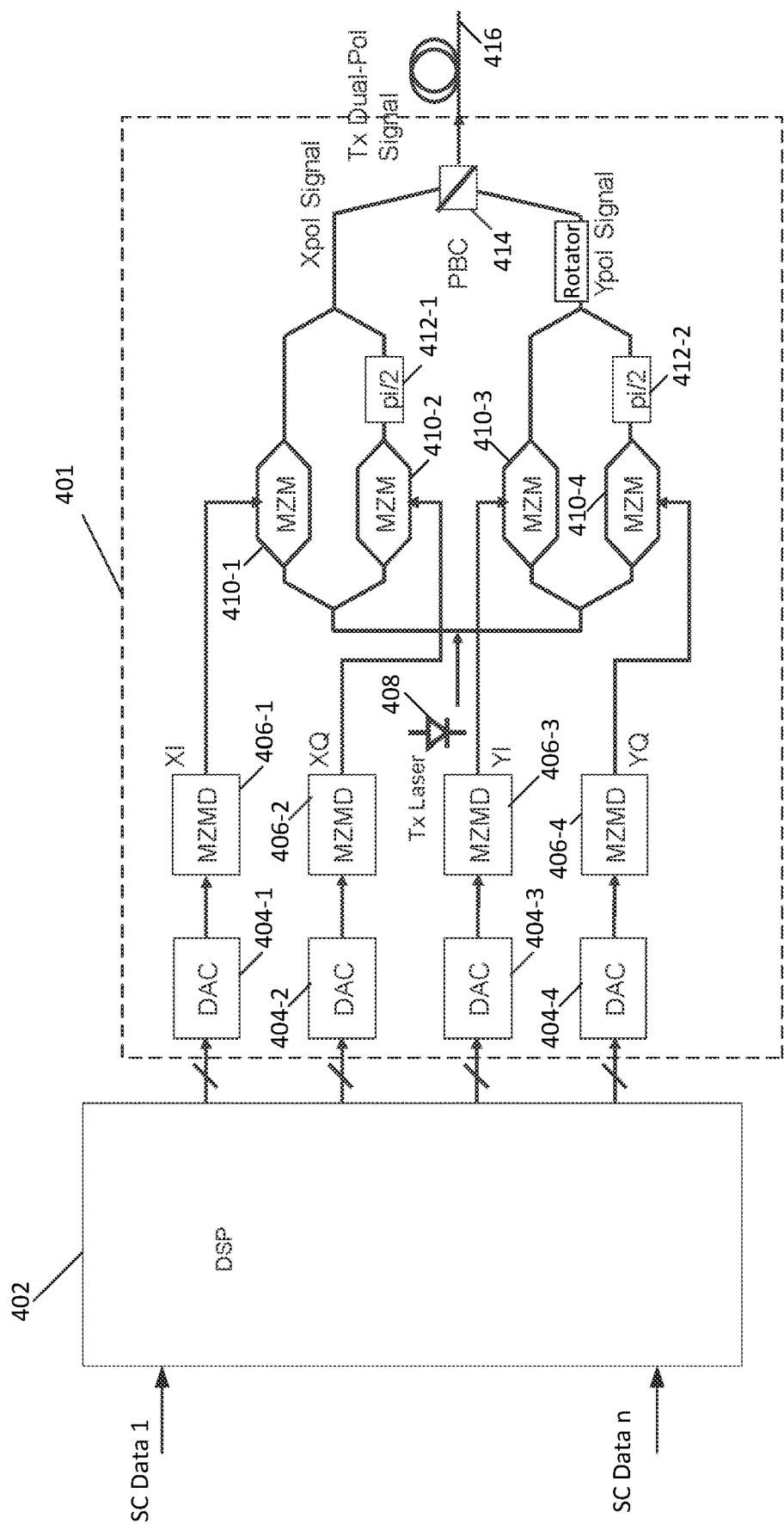
FIG. 6 illustrates an example of an optical transmitter consistent with an aspect of the present disclosure.

FIG. 6 shows an example of an implementation including DACs 404-1 to 404-4, each of which may include a DAC similar to DAC 100 described above. Namely, FIG. 6 illustrates an optical transmitter 202, which includes a digital signal processor (DSP) 402 that receives input data or data streams SC Data 1 to SC Data n. Based on these data streams, DSP 402 may supply a plurality of outputs to D/A and optics block 401 including digital-to-analog conversion (DAC) circuits 404-1 to 404-2, which convert digital signal received from DSP 402 into corresponding analog signals. D/A and optics block 401 also includes driver circuits 406-1 to 406-2 that receive the analog signals from DACs 404-1 to 404-4 adjust the voltages or other characteristics thereof to provide drive signals to a corresponding one of modulators 410-1 to 410-4.

D/A and optics block 401 further includes modulators 410-1 to 410-4, each of which may be a Mach-Zehnder modulator (MZM) that modulates the phase and/or amplitude of the light output from laser 408 having a frequency f0. As further shown in FIG. 6, light output from laser 408, also included in block, 401, is split such that a first portion of the light is supplied to a first MZM pairing including MZMs 410-1 and 410-2 and a second portion of the light is supplied to a second MZM pairing including MZMs 410-3 and 410-4. The first portion of the light is further split into third and fourth portions, such that the third portion is modulated by MZM 410-1 to provide an in-phase (I) component of an X (or TE) polarization component of a modulated optical signal, and the fourth portion is modulated by MZM 410-2 and fed to phase shifter 412-1 to shift the phase of such light by 90 degrees in order to provide a quadrature (Q) component of the X polarization component of the modulated optical signal. Similarly, the second portion of the light is further split into fifth and sixth portions, such that the fifth portion is modulated by MZM 410-3 to provide an I component of a Y (or TM) polarization component of the modulated optical signal, and the sixth portion is modulated by MZM 410-4 and fed to phase shifter 412-2 to shift the phase of such light by 90 degrees to provide a Q component of the Y polarization component of the modulated optical signal.

The optical outputs of MZMs 410-1 and 410-2 are combined to provide an X polarized optical signal including I and Q components and fed to a polarization beam combiner (PBC) 414 provided in block 401. In addition, the outputs of MZMs 410-3 and 410-4 are combined to provide an optical signal that is fed to a polarization rotator, further provided in block 401, that rotates the polarization of such optical signal to provide a modulated optical signal having a Y (or TM) polarization. The Y polarized modulated optical signal is also provided to PBC 414, which combines the X and Y polarized modulated optical signals to provide a polarization multiplexed ("dual-pol") modulated optical signal onto optical fiber 416, for example. In the examples disclosed herein, MZMs 410-1 to 410-4 collectively constitute a modulator.

The polarization multiplexed optical signal output from D/A and optics block 401 includes optical subcarriers, such that each subcarrier has X and Y polarization components and I and Q components. Moreover, each subcarrier SC1 to SCn may be associated with or corresponds to a respective one of data streams SC Data 1 to SC Data n.

Other embodiments will be apparent to those skilled in the art from consideration of the specification. For example, stages 104-1 and 104-2 are considered to be binary stages of DAC 100, whereas stages 104-n and 104-n+1 are considered unary stages of DAC 100. It is understood that, instead of a combination of binary and unary stages, DAC 100 may include only binary stages or only unary stages. It is intended that the specification and examples be considered as exemplary only, with a true scope and spirit of the invention being indicated by the following claims.

What is claimed is:

1. A digital-to-analog converter (DAC) circuit, comprising:
    a resistor ladder including a plurality of stages, one of the stages including a first resistor and a second resistor;
    a switch including a third transistor coupled to one of the first and second resistors; and
    a control circuit operable to adjust an on-resistance of the transistor, such that a sum of the resistances of the first and second resistors and the on resistance is equal to a predetermined amount,
    wherein the switch includes the first transistor, the control circuit including the second transistor, such that the third resistor is connected in series with the second resistor, the third resistor having a resistance corresponding to a resistance of the first resistor.

2. A DAC circuit in accordance with claim 1, wherein the switch is a first switch, the DAC further including a second switch, the first switch including an n channel metal-oxide-semiconductor (MOS) transistor and the second switch including a p channel MOS transistor.

3. A DAC circuit in accordance with claim 1, further including a control loop that applies a voltage to a gate of the second transistor and supplies the voltage to a gate of the first transistor.

4. A digital-to-analog converter (DAC) circuit, comprising:
    a resistor ladder including a plurality of stages, one of the stages including a first resistor and a second resistor;
    a switch including a third transistor coupled to one of the first and second resistors; and
    a control circuit operable to adjust an on-resistance of the transistor, such that a sum of the resistances of the first and second resistors and the on resistance is equal to a predetermined amount,
    wherein the control circuit has an output, the DAC circuit further including a capacitor connected to an output of the control circuit.

5. A digital-to-analog converter (DAC) circuit, comprising:
    a resistor ladder including a plurality of stages, one of the stages including a first resistor and a second resistor;
    a switch including a third transistor coupled to one of the first and second resistors;
    a control circuit operable to adjust an on-resistance of the transistor, such that a sum of the resistances of the first and second resistors and the on resistance is equal to a predetermined amount; and
    a current source provided in the control circuit, the current source being operable to adjust an output of the control circuit based on an output of the DAC circuit.

6. A digital-to-analog converter (DAC) circuit, comprising:
    a resistor ladder including a plurality of stages, one of the stages including a first resistor and a second resistor;
    a switch including a third transistor coupled to one of the first and second resistors; and
    a control circuit operable to adjust an on-resistance of the transistor, such that a sum of the resistances of the first and second resistors and the on resistance is equal to a predetermined amount, wherein one of the plurality of stages is a unary stage.

7. A digital-to-analog converter (DAC) circuit, comprising:
- a resistor ladder including a plurality of stages, one of the stages including a first resistor and a second resistor;
- a switch including a third transistor coupled to one of the first and second resistors; and
- a control circuit operable to adjust an on-resistance of the transistor, such that a sum of the resistances of the first and second resistors and the on resistance is equal to a predetermined amount, wherein a first one of the plurality of stages is a unary stage and a second one of the plurality of stages is a binary stage.

* * * * *